(12) United States Patent  
Eakin

(10) Patent No.: US 9,347,649 B2  
(45) Date of Patent: May 24, 2016

(54) DISPLAY APPARATUS INCORPORATING REFLECTIVE AND ABSORPTIVE POLARIZERS

(71) Applicant: Pixtronix, Inc., San Diego, CA (US)

(72) Inventor: James Eakin, Worcester, MA (US)

(73) Assignee: Pixtronix, Inc., San Diego, CA (US)

( * ) Notice: Subject to any disclaimer, the term of this patent is extended or adjusted under 35 U.S.C. 154(b) by 622 days.

(21) Appl. No.: 13/773,244

(22) Filed: Feb. 21, 2013

(65) Prior Publication Data

US 2014/0232728 A1 Aug. 21, 2014

(51) Int. Cl.
| | |
|---|---|
| *F21V 9/14* | (2006.01) |
| *H01L 51/52* | (2006.01) |
| *G02B 27/28* | (2006.01) |
| *G02B 26/02* | (2006.01) |

(52) U.S. Cl.  
CPC . *F21V 9/14* (2013.01); *G02B 26/02* (2013.01); *G02B 27/281* (2013.01); *H01L 51/5281* (2013.01)

(58) Field of Classification Search  
CPC ............... F21V 9/00; F21V 9/14; F21V 9/16; G02B 26/02; G02B 26/06; G02B 26/08; G02B 27/281; G02B 27/283; G02B 27/286; H01L 51/5281; Y02B 20/36  
USPC ........................................ 362/97.1, 97.02, 19  
See application file for complete search history.

(56) References Cited

U.S. PATENT DOCUMENTS

| | | | |
|---|---|---|---|
| 6,025,897 A | 2/2000 | Weber et al. | |
| 6,124,905 A | 9/2000 | Iijima | |
| 6,975,455 B1 | 12/2005 | Kotchick et al. | |
| 8,054,417 B2 | 11/2011 | Kim et al. | |
| 2007/0279727 A1* | 12/2007 | Gandhi | ............... G02B 6/0035 359/242 |
| 2008/0158877 A1* | 7/2008 | Hsieh | .................. G02F 1/13362 362/235 |
| 2010/0208497 A1 | 8/2010 | Song et al. | |

FOREIGN PATENT DOCUMENTS

WO 03103068 A2 12/2003

OTHER PUBLICATIONS

International Search Report and Written Opinion—PCT/US2014/016251—ISA/EPO—May 9, 2014.

* cited by examiner

*Primary Examiner* — Ali Alavi  
(74) *Attorney, Agent, or Firm* — Edward A. Gordon; Foley & Lardner LLP

(57) ABSTRACT

This disclosure provides systems, methods and apparatus for reducing ambient light reflections from a surface of a display device in a power efficient manner. The display device includes a reflecting circular polarizer (RCP) and an absorbing circular polarizer (ACP) having the same polarity. The RCP provides light recycling functionality, while the ACP provides ambient light reflection suppression. In some implementations, the light generated by the display device is polarized by the RCP before it is incident on the ACP, which is located at the front of the display device. Because the polarities of the RCP and the ACP are the same, the ACP substantially passes all of the incident polarized light towards the front of the display device.

23 Claims, 14 Drawing Sheets

DISPLAY APPARATUS INCORPORATING REFLECTIVE AND ABSORPTIVE POLARIZERS

TECHNICAL FIELD

This disclosure relates to the field of imaging displays, and in particular to imaging displays employing polarizers.

DESCRIPTION OF THE RELATED TECHNOLOGY

Portable devices such as smartphones, tablets, etc., typically include a display device that displays graphical content to a user. The display device may include several surfaces off of which light can be reflected in certain viewing conditions. When the display device is viewed in bright ambient light conditions (such as under direct sunlight), these surfaces can reflect the ambient light back to the user. The reflected ambient light may reduce the effective contrast ratio and color gamut of the display device, causing the display content to appear dull and at times unreadable.

It is desirable that a display device provide acceptable visual performance in a wide range of ambient light conditions. Traditional solutions for addressing the above-referenced reflections include disposing coatings or films over the display device. For example, some solutions dispose a light-absorbing polarizer film over the topmost surface of the display device. While the polarizer reduces ambient light reflections to a certain extent, the polarizer also absorbs light, such as light from the display's backlight, whose polarity is different from the pass through polarity of the polarizer, effectively reducing the brightness of the display device. One approach to counter the light reduction caused by the polarizer is to increase the power supplied to the backlight of the display device. However, increasing the power can prove disadvantageous in applications such as portable electronics where power efficiency is important.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus having a reflecting circular polarizing layer configured to pass light having a first circular polarity received from the rear of the apparatus, and to reflect light having a polarity different from the first circular polarity received from the rear of the apparatus back toward the rear of the apparatus. The apparatus further includes an absorbing circular polarizing layer, disposed proximate a front surface of the apparatus and in front of the reflecting circular polarization layer. The absorbing circular polarizing layer is configured to pass light having the first circular polarity and to absorb light having a polarity different from the first circular polarity.

In some implementations, the apparatus also includes a backlight disposed between a front facing light reflective layer and the reflecting circular polarizing layer, the backlight including a light source and a light guide. In some implementations, the apparatus also includes a light modulation layer including a plurality of electromechanical systems (EMS) display elements, disposed in front of the reflecting circular polarizing layer and behind the absorbing circular polarizing layer, configured to selectively, responsive to image data, pass light received from the reflecting circular polarizing layer.

In some implementations, the apparatus also includes an aperture layer disposed between the light modulation layer and the reflecting circular polarizing layer. In some of these implementations, the aperture layer includes a rear facing reflecting circular polarizing surface configured to reflect light having the first circular polarity that is passed by the reflecting circular polarizing layer back towards the rear of the apparatus. In some other implementations the aperture layer is disposed between the backlight and the reflecting circular polarizing layer.

In some implementations, the reflecting circular polarizer layer is selected from a group consisting of a reflective linear polarizing layer in combination with a quarter wave retarder and a cholesteric liquid crystal circular polarizing layer. In some implementations, the absorbing circular polarizing layer is disposed on a front surface of the apparatus.

In some implementations, the apparatus also includes an organic light emitting diode (OLED) array disposed between a front facing light reflective layer and the reflecting circular polarizer layer.

In some implementations, the apparatus also includes a display having the reflective circular polarizing layer and the absorbing circular polarizing layer, a processor that is configured to communicate with the display, the processor being configured to process image data, and a memory device that is configured to communicate with the processor.

In some implementations, the display further includes a driver circuit configured to send at least one signal to the display, and a controller configured to send at least a portion of the image data to the driver circuit. In some implementations, the display further includes an image source module configured to send the image data to the processor, where the image source module includes at least one of a receiver, transceiver, and transmitter, and an input device configured to receive input data and to communicate the input data to the processor.

Another innovative aspect of the subject matter described in this disclosure can be implemented in a display apparatus, having a reflecting circular polarizing layer configured to pass light having a first circular polarity received from the rear of the display apparatus, and to reflect light having a polarity different from the first circular polarity received from the rear of the display apparatus back toward the rear of the display apparatus. The display apparatus also includes a light modulation layer including a plurality of electromechanical systems (EMS) display elements, disposed in front of the reflecting circular polarizing layer, configured to, responsive to image data, selectively pass light received from the reflecting circular polarizing layer, and an absorbing circular polarizing layer, disposed in front of the light modulation layer, configured to pass light having the first circular polarity and to absorb light having a polarity different from the first circular polarity.

In some implementations, the reflecting circular polarizer layer is selected from a group consisting of a reflective linear polarizing layer in combination with a quarter wave retarder and a cholesteric liquid crystal circular polarizing layer. In some implementations, the absorbing circular polarizing layer is fabricated on a front surface of the apparatus.

Another innovative aspect of the subject matter described in this disclosure can be implemented in a display apparatus having reflecting circular polarizing means for passing light having a first circular polarity received from the rear of the display apparatus and for reflecting light having a polarity different from the first circular polarity received from the rear of the display apparatus back toward the rear of the display apparatus. The display apparatus also includes absorbing circular polarizing means, disposed proximate a front surface of the display apparatus and in front of the reflecting circular polarizing means, for passing light having the first circular polarity and absorbing light having a polarity different from the first circular polarity.

In some implementations, the absorbing circular polarizing means is disposed on a front surface of the display apparatus. In some implementations, the display apparatus also includes backlighting means, disposed between a front facing light reflective layer and the reflecting circular polarizing means, for providing uniform illumination of the display apparatus. In some implementations, the display apparatus can include light modulating means including a plurality of electromechanical systems (EMS) display elements, disposed in front of the reflecting circular polarizing means and behind the absorbing circular polarizing means, for selectively, responsive to image data, passing light received from the reflecting circular polarizing means.

In some implementations, the display apparatus also includes an organic light emitting diode (OLED) array disposed between the front facing light reflective means and the reflecting circular polarizing means.

Another innovative aspect of the subject matter described in this disclosure can be implemented in a method including receiving light from a backlight located at the rear of a display apparatus. The method also includes using a reflective circular polarizer to pass light having a first circular polarity towards the front of the display apparatus, using the reflective circular polarizer to reflect light having a polarity different from the first circular polarity back towards the rear of the display apparatus, and proximate to the front of the display apparatus, absorbing light having a polarity different from the first circular polarity using an absorbing circular polarizer.

In some implementations, the method also includes receiving light reflected by the reflective circular polarizer and reflecting the received light back towards the front of the display apparatus using a front facing reflective film located proximate to the rear of the display apparatus.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCDs), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1A:
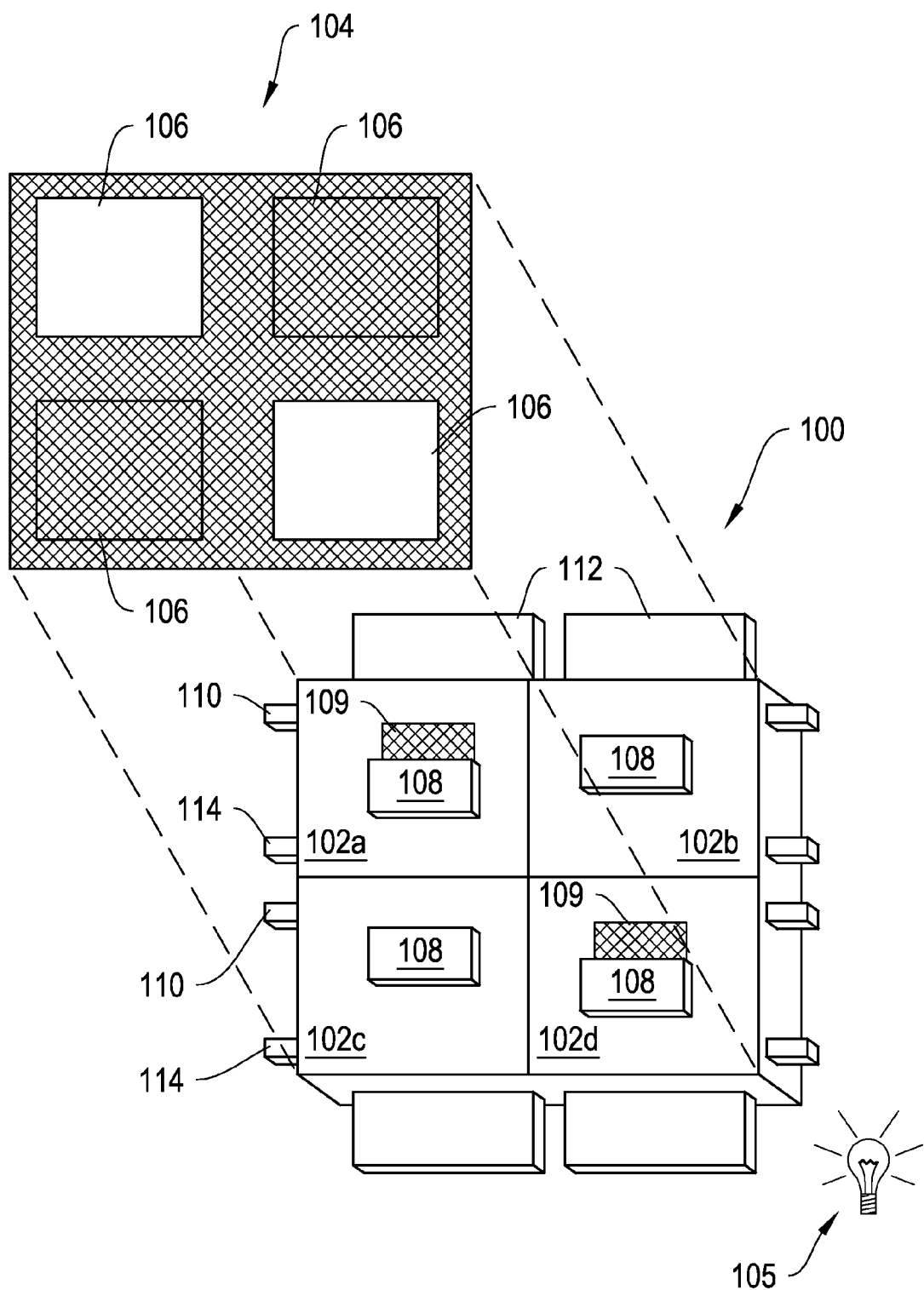
FIG. 1A shows an example schematic diagram of a direct-view microelectromechanical systems (MEMS) based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

A display apparatus can include a plurality of electromechanical systems (EMS) devices, responsive to image data, for rendering images. EMS devices may include nanoelectromechanical systems (NEMS), microelectromechanical systems (MEMS) or larger scale electromechanical systems devices. The display apparatus can include a reflecting circular polarizer (RCP) in addition to an absorbing circular polarizer (ACP) to provide reduction in ambient light reflections in a power efficient manner. The ACP can be disposed over a cover plate of the display. In this position, the ACP suppresses reflection of ambient light that is incident on the cover plate. The RCP can be disposed between the ACP and a backlight. In this position, the RCP allows light having the same polarity as the RCP to pass through substantially unattenuated. However, the RCP reflects light having a polarity that is different than the pass polarity of the RCP.

The polarities of the RCP and the ACP can be selected to be the same. The ACP and the RCP are positioned such that the light emanating from the display device passes first through the RCP and then through the ACP. The light is first polarized by the RCP before it is incident on the ACP. When the polarity of both the polarizers is the same, the ACP passes through a substantial portion of the light passed through the RCP. In this manner, the display device alleviates the disadvantage of a more traditional approach in which a polarizer employed to suppress ambient light also, undesirably, attenuates the light emanating from the display.

The RCP, in conjunction with a front-facing reflective surface positioned behind the RCP, also can provide light recycling. Incident light that is not passed by the RCP can be reflected back towards the front-facing reflective surface. The front-facing reflective surface, in turn, reflects the light back onto the RCP, which results in an additional portion of light being passed. Again, light that is not passed is reflected back towards the reflective surface. This process continues until a substantial portion of the light generated by the display is passed by the RCP.

In some implementations, the ACP is or includes a combination of linear polarizers and quarter wave retarders, or waveplates. In such implementations, a transmission axis of the linear polarizers is positioned at an angle of 45 degrees with respect to a slow and fast axis of the quarter wave retarders. In some other implementations, the ACP includes a cholesteric liquid crystal circular polarizer.

In some implementations, the light emanating from the display device forms an image by a microelectromechanical systems (MEMS) shutter array modulating light emitted by a backlight included in the display device. The shutter array, in response to image data, selectively allows propagation of light generated by the backlight towards and out of the front of the display device. In some other implementations, the image formed by the display device is produced by an array of organic light emitting diodes (OLEDs). The OLED array, in response to image data, selectively generates light that is transmitted towards and out of the front of the display device.

Particular implementations of the subject matter described in this disclosure can be implemented to realize one or more of the following potential advantages. The inclusion of an ACP and a RCP with the same circular polarity in a display device may provide a reduction in ambient light reflections with reduced attenuation of the light generated by the display device. More particularly, in some implementations, the combination of the RCP with the ACP can provide an improvement in light output of as much as about 20% in comparison to display apparatus that employ only an absorbing polarizer at the front of the display device. As a result, the display device need not expend a considerable amount of additional power to compensate for the attenuation caused by traditional polarizer film configurations.

The RCP in conjunction with a front facing reflective layer provides light recycling that further improves the light output of the display device. For example, the RCP includes a rear-facing reflective layer. The light generated by the display device is partially passed though by the RCP, while the remaining portion is reflected back towards the front-facing reflective layer. The front-facing reflective layer, in turn, reflects this light back towards the RCP at a future point in time. Thus, the light that was not passed through by the RCP at one instant in time may be passed through by the RCP at a future instant in time. Thus, over time, a substantial portion of the light generated by the display device is passed through to the front of the display device. As a result, the light output of the display device is enhanced without expending additional power.

FIG. 1A shows a schematic diagram of a direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (e.g., interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, $V_{WE}$"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, such as transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
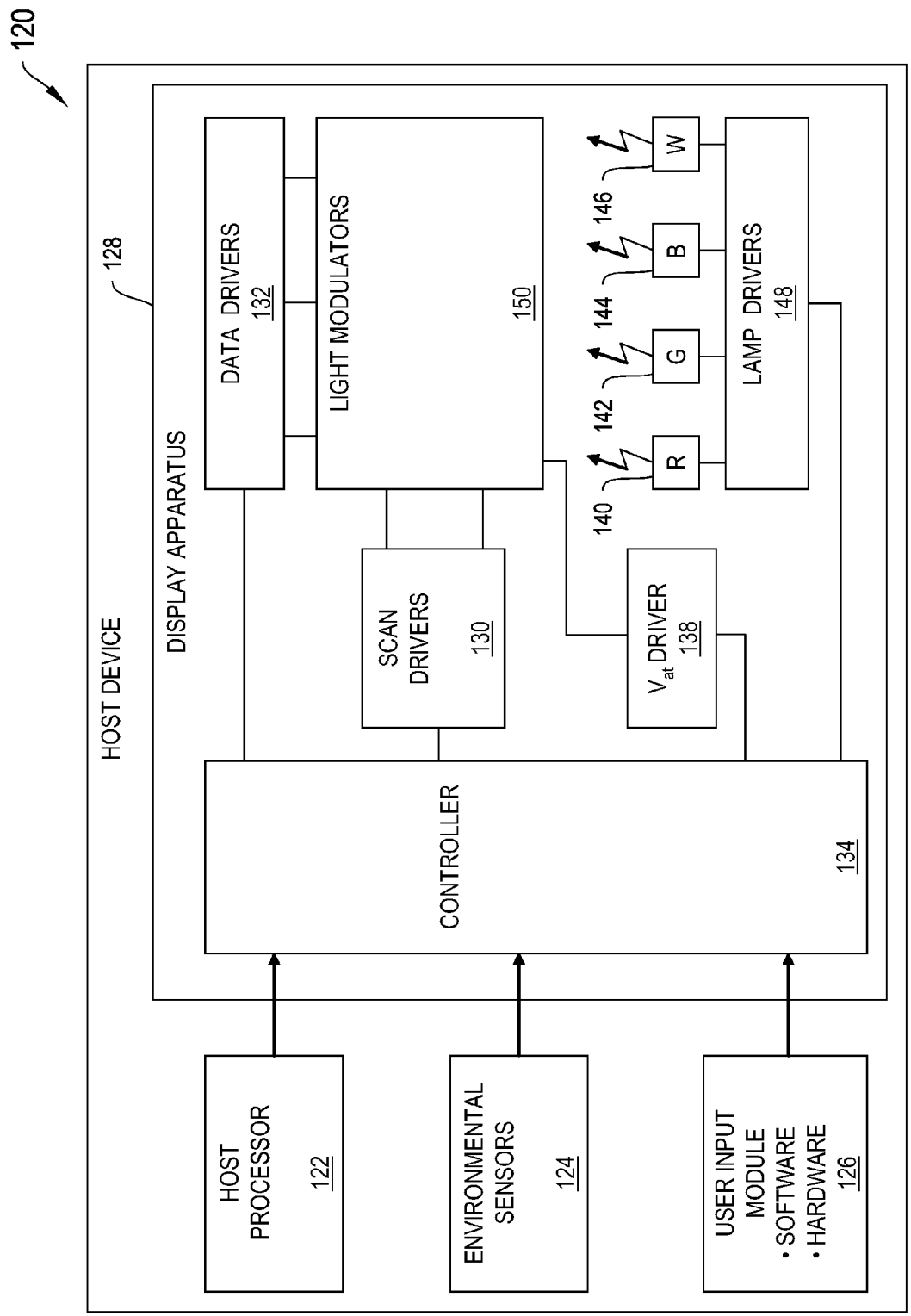
FIG. 1B shows an example block diagram of a host device.

FIG. 1B shows an example of a block diagram of a host device 120 (i.e., cell phone, smart phone, PDA, MP3 player, tablet, e-reader, netbook, notebook, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in sequences, which in some implementations may be predetermined, grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (e.g., scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array 150, for instance by addressing only every $5^{th}$ row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2A:
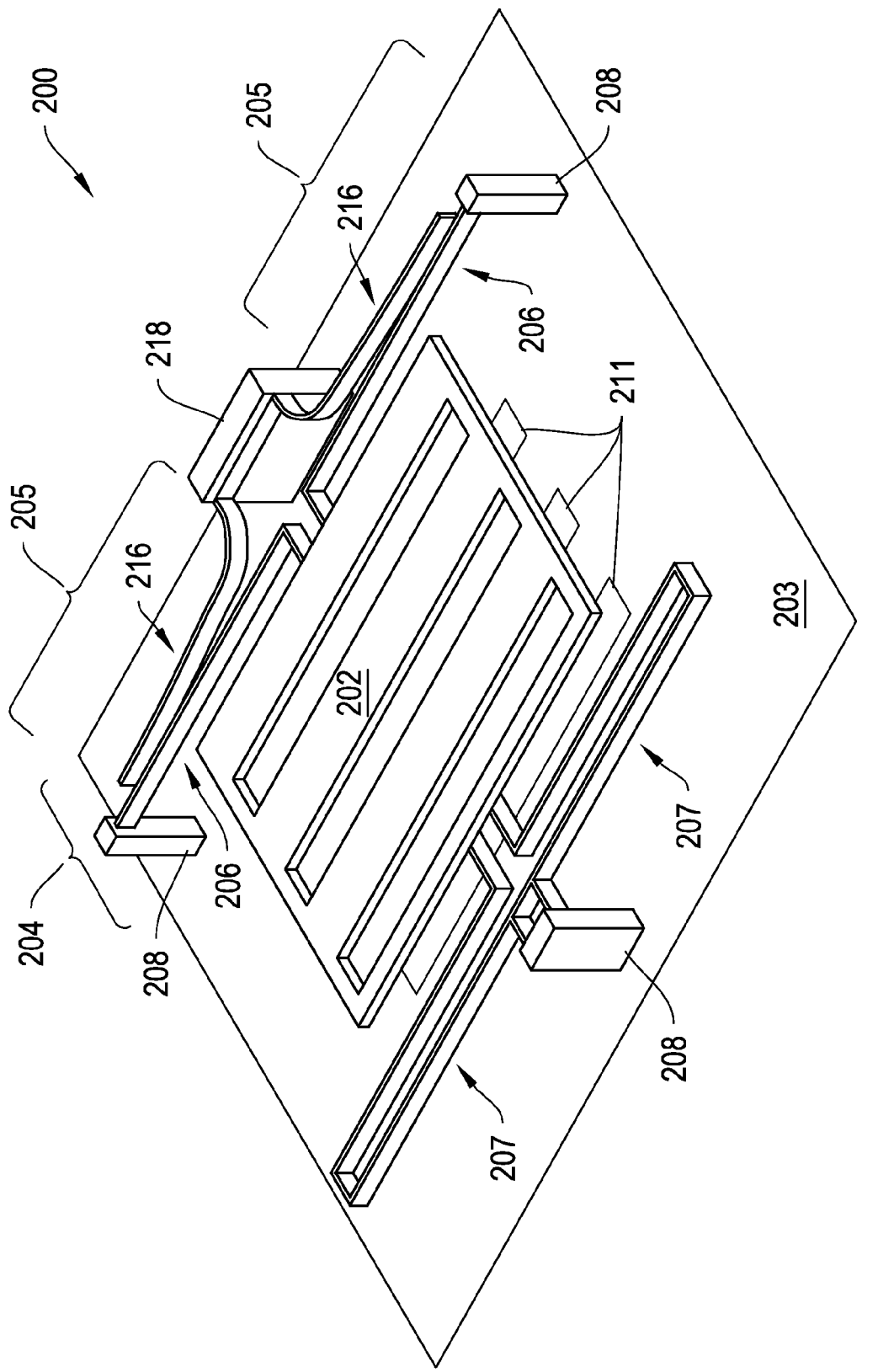
FIG. 2A shows an example perspective view of an illustrative shutter-based light modulator.

FIG. 2A shows a perspective view of an illustrative shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface 203 includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate 204. If the substrate 204 is transparent, such as glass or plastic, then the aperture holes 211 are formed in a layer of light-blocking material deposited on the substrate 203. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and a separate set of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases it is appropriate to include switching and/or data storage elements within each pixel of the array (the so-called active matrix) to improve the speed, the luminance level and/or the power dissipation performance of the display.

Figure 2B:
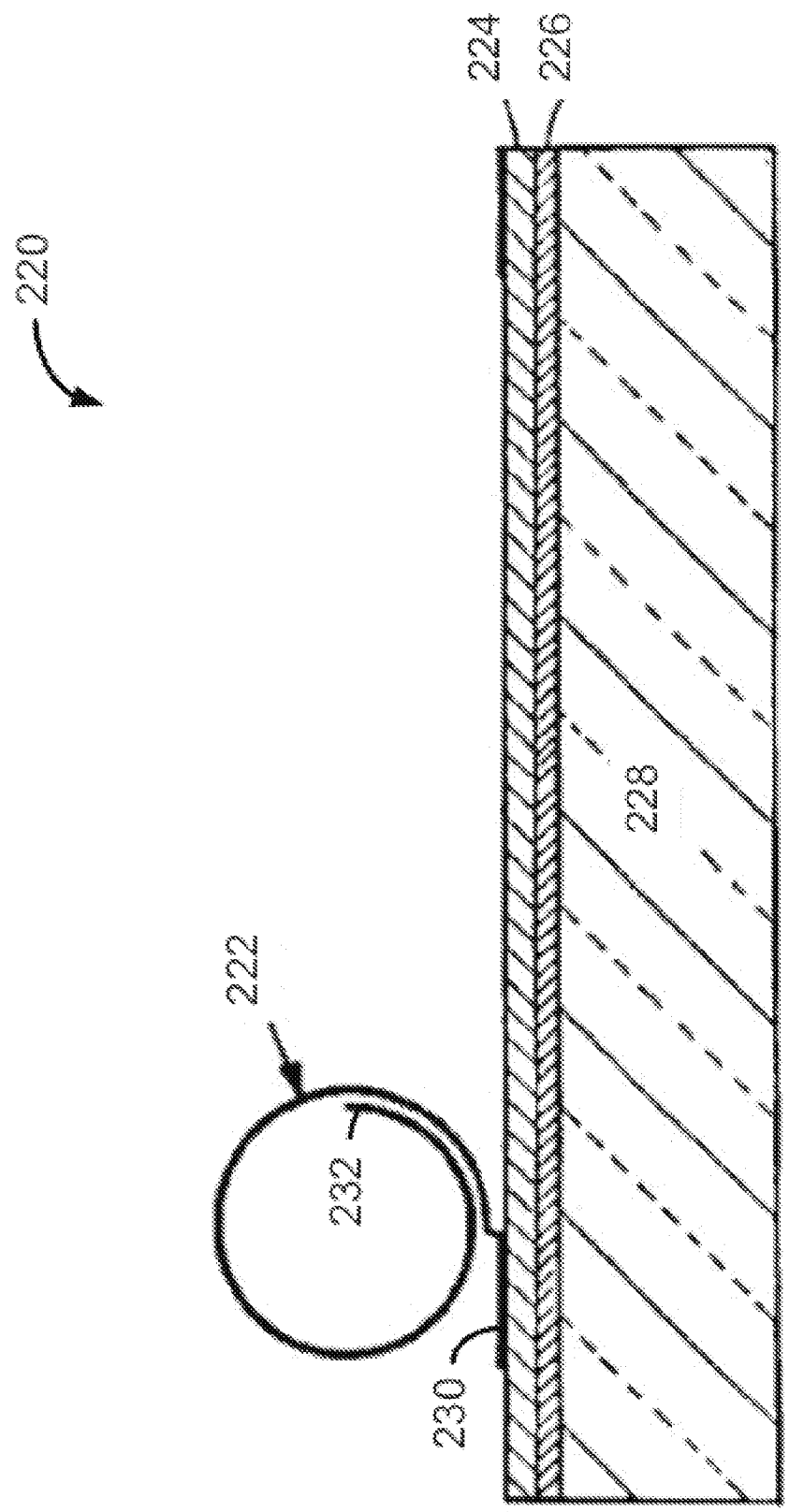
FIG. 2B shows an example cross sectional view of a rolling actuator shutter-based light modulator.

The display apparatus 100, in alternative implementations, includes display elements other than transverse shutter-based light modulators, such as the shutter assembly 200 described above. For example, FIG. 2B shows an example cross sectional view of a rolling actuator shutter-based light modulator 220. The rolling actuator shutter-based light modulator 220 is suitable for incorporation into an alternative implementation of the MEMS-based display apparatus 100 of FIG. 1A. A rolling actuator-based light modulator includes a movable electrode disposed opposite a fixed electrode and biased to move in a particular direction to function as a shutter upon application of an electric field. In some implementations, the light modulator 220 includes a planar electrode 226 disposed between a substrate 228 and an insulating layer 224 and a movable electrode 222 having a fixed end 230 attached to the insulating layer 224. In the absence of any applied voltage, a movable end 232 of the movable electrode 222 is free to roll towards the fixed end 230 to produce a rolled state. Application of a voltage between the electrodes 222 and 226 causes the movable electrode 222 to unroll and lie flat against the insulating layer 224, whereby it acts as a shutter that blocks light traveling through the substrate 228. The movable electrode 222 returns to the rolled state by means of an elastic restoring force after the voltage is removed. The bias towards a rolled state may be achieved by manufacturing the movable electrode 222 to include an anisotropic stress state.

Figure 2C:
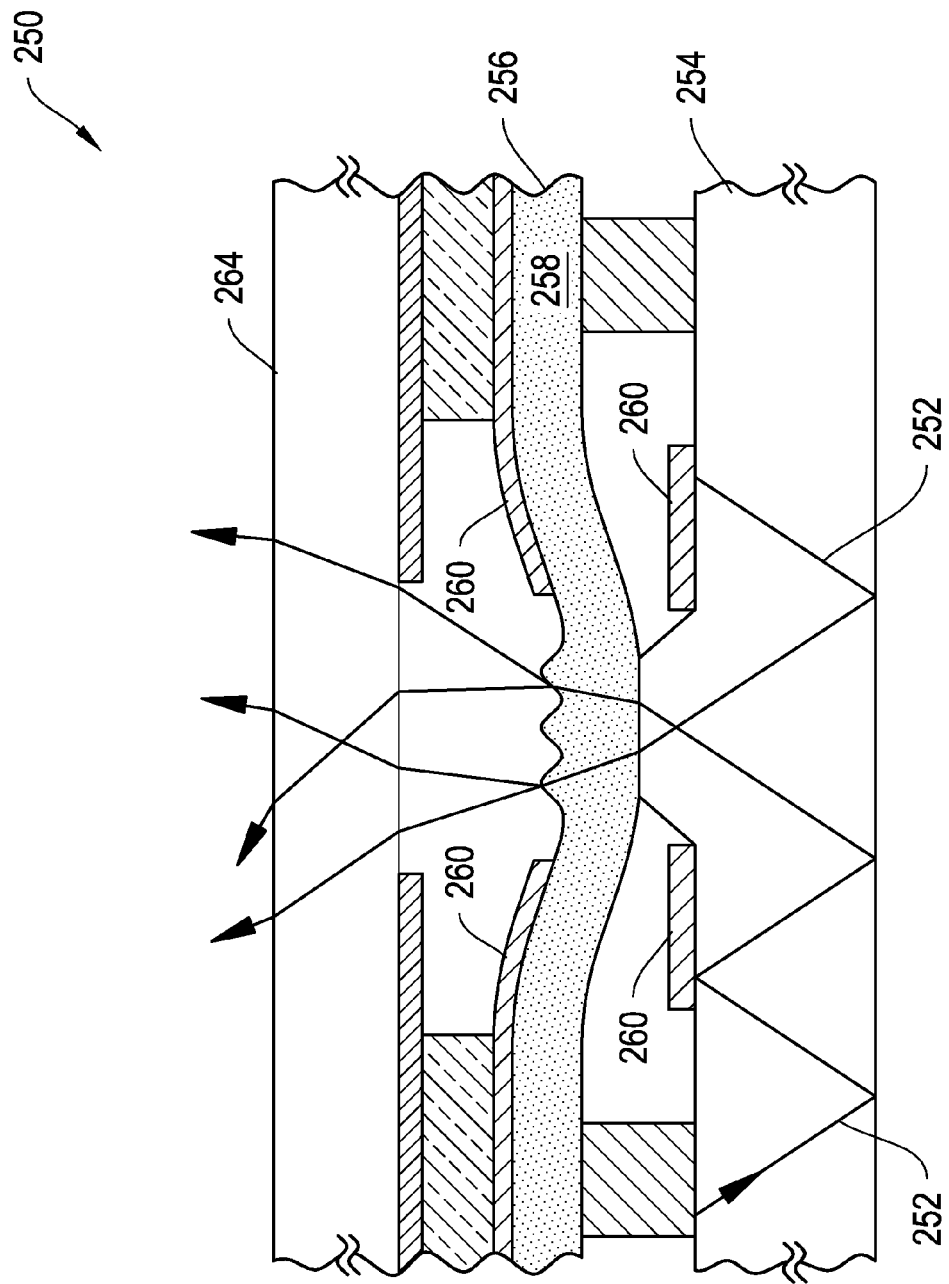
FIG. 2C shows an example cross sectional view of an illustrative non shutter-based MEMS light modulator.

FIG. 2C shows an example cross sectional view of an illustrative non shutter-based MEMS light modulator 250. The light tap modulator 250 is suitable for incorporation into an alternative implementation of the MEMS-based display apparatus 100 of FIG. 1A. A light tap works according to a principle of frustrated total internal reflection (TIR). That is, light 252 is introduced into a light guide 254, in which, without interference, light 252 is, for the most part, unable to escape the light guide 254 through its front or rear surfaces due to TIR. The light tap 250 includes a tap element 256 that has a sufficiently high index of refraction that, in response to the tap element 256 contacting the light guide 254, the light 252 impinging on the surface of the light guide 254 adjacent the tap element 256 escapes the light guide 254 through the tap element 256 towards a viewer, thereby contributing to the formation of an image.

In some implementations, the tap element 256 is formed as part of a beam 258 of flexible, transparent material. Electrodes 260 coat portions of one side of the beam 258. Opposing electrodes 262 are disposed on the light guide 254. By applying a voltage across the electrodes 260 and 262, the position of the tap element 256 relative to the light guide 254 can be controlled to selectively extract light 252 from the light guide 254.

Figure 2D:
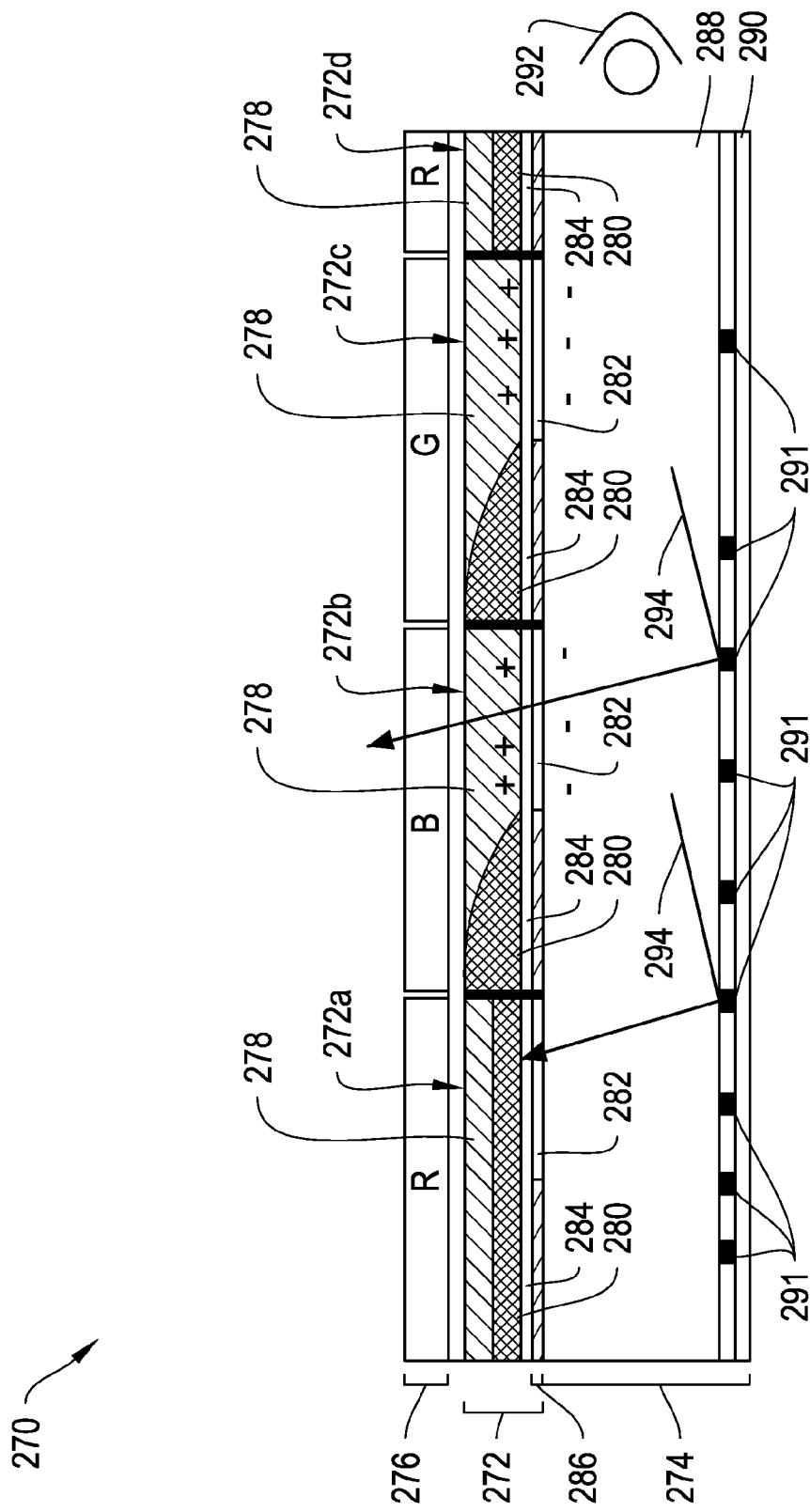
FIG. 2D shows an example cross sectional view of an electrowetting-based light modulation array.

FIG. 2D shows an example cross sectional view of an electrowetting-based light modulation array 270. The electrowetting-based light modulation array 270 is suitable for incorporation into an alternative implementation of the MEMS-based display apparatus 100 of FIG. 1A. The light modulation array 270 includes a plurality of electrowetting-based light modulation cells 272a-d (generally "cells 272") formed on an optical cavity 274. The light modulation array 270 also includes a set of color filters 276 corresponding to the cells 272.

Each cell 272 includes a layer of water (or other transparent conductive or polar fluid) 278, a layer of light absorbing oil 280, a transparent electrode 282 (made, for example, from indium-tin oxide (ITO)) and an insulating layer 284 positioned between the layer of light absorbing oil 280 and the transparent electrode 282. In the implementation described herein, the electrode takes up a portion of a rear surface of a cell 272.

The remainder of the rear surface of a cell 272 is formed from a reflective aperture layer 286 that forms the front surface of the optical cavity 274. The reflective aperture layer 286 is formed from a reflective material, such as a reflective metal or a stack of thin films forming a dielectric mirror. For each cell 272, an aperture is formed in the reflective aperture layer 286 to allow light to pass through. The electrode 282 for the cell is deposited in the aperture and over the material forming the reflective aperture layer 286, separated by another dielectric layer.

The remainder of the optical cavity 274 includes a light guide 288 positioned proximate the reflective aperture layer 286, and a second reflective layer 290 on a side of the light guide 288 opposite the reflective aperture layer 286. A series of light redirectors 291 are formed on the rear surface of the light guide, proximate the second reflective layer. The light redirectors 291 may be either diffuse or specular reflectors. One or more light sources 292, such as LEDs, inject light 294 into the light guide 288.

In an alternative implementation, an additional transparent substrate (not shown) is positioned between the light guide 288 and the light modulation array 270. In this implementation, the reflective aperture layer 286 is formed on the additional transparent substrate instead of on the surface of the light guide 288.

In operation, application of a voltage to the electrode 282 of a cell (for example, cell 272b or 272c) causes the light absorbing oil 280 in the cell to collect in one portion of the cell 272. As a result, the light absorbing oil 280 no longer obstructs the passage of light through the aperture formed in the reflective aperture layer 286 (see, for example, cells 272b and 272c). Light escaping the backlight at the aperture is then able to escape through the cell and through a corresponding color filter (for example, red, green or blue) in the set of color filters 276 to form a color pixel in an image. When the electrode 282 is grounded, the light absorbing oil 280 covers the aperture in the reflective aperture layer 286, absorbing any light 294 attempting to pass through it.

The area under which oil 280 collects when a voltage is applied to the cell 272 constitutes wasted space in relation to forming an image. This area is non-transmissive, whether a voltage is applied or not. Therefore, without the inclusion of the reflective portions of reflective apertures layer 286, this area absorbs light that otherwise could be used to contribute to the formation of an image. However, with the inclusion of the reflective aperture layer 286, this light, which otherwise would have been absorbed, is reflected back into the light guide 290 for future escape through a different aperture. The electrowetting-based light modulation array 270 is not the only example of a non-shutter-based MEMS modulator suitable for inclusion in the display apparatus described herein. Other forms of non-shutter-based MEMS modulators could likewise be controlled by various ones of the controller functions described herein without departing from the scope of this disclosure.

Figure 3:
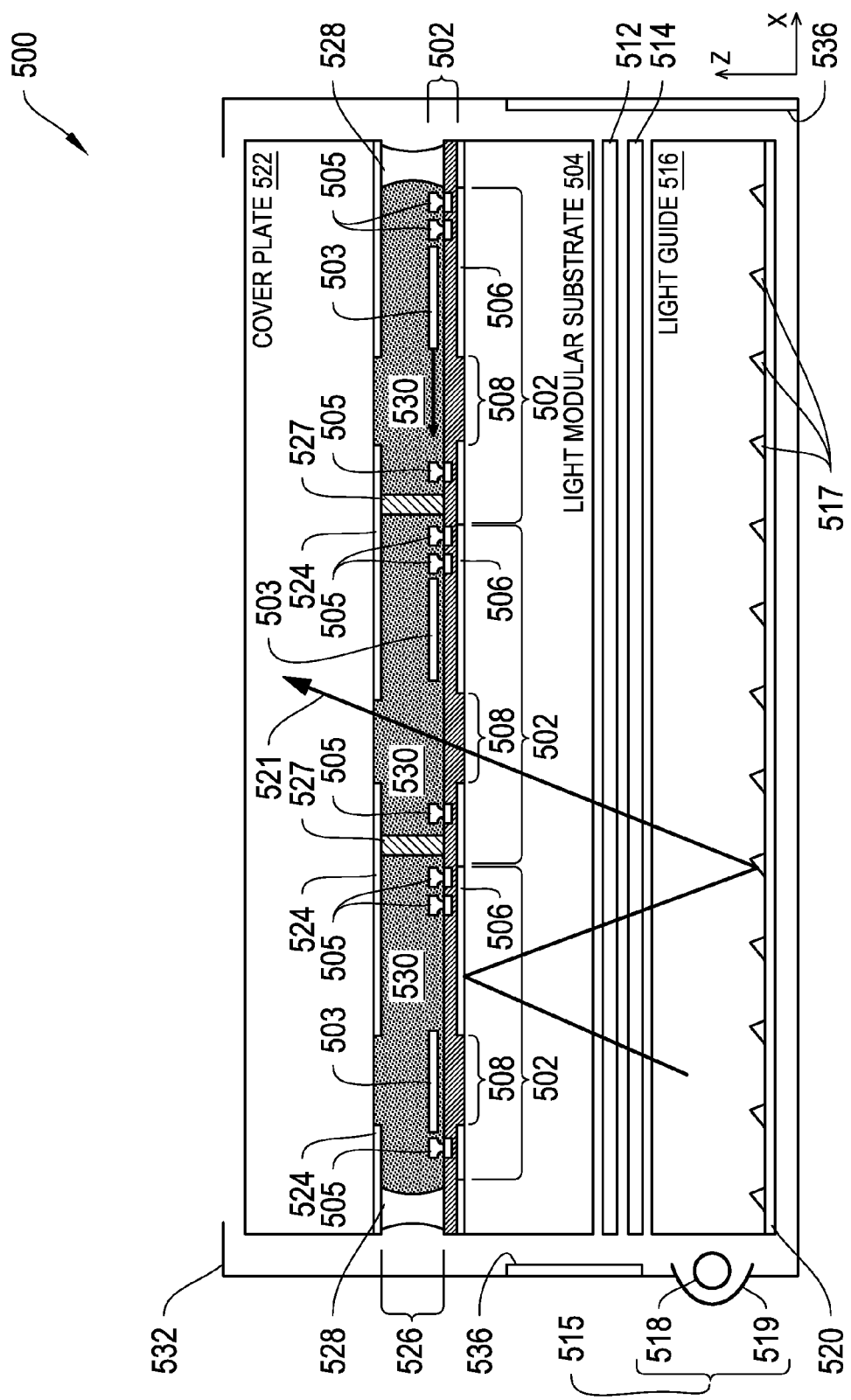
FIG. 3 shows an example cross sectional view of a display apparatus incorporating shutter-based light modulators.

FIG. 3 shows an example cross sectional view of a display apparatus 500 incorporating shutter-based light modulators (shutter assemblies) 502. Each shutter assembly 502 incorporates a shutter 503 and an anchor 505. Not shown are the compliant beam actuators which, when connected between the anchors 505 and the shutters 503, help to suspend the shutters 503 a short distance above the surface. The shutter assemblies 502 are disposed on a transparent substrate 504, such a substrate made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition (CVD). In some other implementations, the rear-facing reflective layer 506 can be formed from a mirror, such as a dielectric mirror. A dielectric mirror can be fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state.

The display apparatus 500 includes an optional diffuser 512 and/or an optional brightness enhancing film 514 which separate the substrate 504 from a planar light guide 516. The light guide 516 includes a transparent, i.e., glass or plastic material. The light guide 516 is illuminated by one or more light sources 518. The light sources 518 can be, for example, and without limitation, incandescent lamps, fluorescent lamps, lasers or light emitting diodes (LEDs). A reflector 519 helps direct light from lamp 518 towards the light guide 516. The light guide 516, the light source 518 and the reflector 519 together form a backlight 540. A front-facing reflective film 520 is disposed behind the backlight 540, reflecting light towards the shutter assemblies 502. Light rays such as ray 521 from the backlight 540 that do not pass through one of the shutter assemblies 502 will be returned to the backlight 540 and reflected again from the film 520. In this fashion light that fails to leave the display apparatus 500 to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light redirectors 517 can be molded into the plastic body of light guide 516 with shapes that can be alternately triangular, trapezoidal, or curved in cross section. The density of the prisms 517 generally increases with distance from the lamp 518.

In some implementations, the aperture layer 506 can be made of a light absorbing material, and in alternate implementations the surfaces of shutter 503 can be coated with either a light absorbing or a light reflecting material. In some other implementations, the aperture layer 506 can be deposited directly on the surface of the light guide 516. In some implementations, the aperture layer 506 need not be disposed on the same substrate as the shutters 503 and anchors 505 (such as in the MEMS-down configuration described below).

In some implementations, the light sources 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps. In some other implementations, the light source 518 may include cyan, magenta, yellow and white lamps, red, green, blue and white lamps. In some other implementations, additional lamps may be included in the light source 518. For example, if using five colors, the light source 518 may include red, green, blue, cyan and yellow lamps. In some other implementations, the light source 518 may include white, orange, blue, purple and green lamps or white, blue, yellow, red and cyan lamps. If using six colors, the light source 518 may include red, green, blue, cyan, magenta and yellow lamps or white, cyan, magenta, yellow, orange and green lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a distance, which in some implementations may be predetermined, away from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about $10^4$ V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid 530) and sealing the fluid (such as with an adhesive) within a fluid space or gap in a MEMS display cell. The fluid 530 is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In some implementations, in order to reduce the actuation voltages, the liquid has a viscosity below 70 centipoise. In some other implementations, the liquid has a viscosity below 10 centipoise. Liquids with viscosities below 70 centipoise can include materials with low molecular weights: below 4000 grams/mole, or in some cases below 400 grams/mole. Fluids 530 that also may be suitable for such implementations include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. Other fluids considered for these display assemblies include butyl acetate and dimethylformamide. Still other useful fluids for these displays include hydro fluoro ethers, perfluoropolyethers, hydro fluoro poly ethers, pentanol, and butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight 540 and the other component parts together around the edges. The assembly bracket 532 is fastened with screws or indent tabs to add rigidity to the combined display apparatus 500. In some implementations, the light source 518 is molded in place by an epoxy potting compound. The reflectors 536 help return light escaping from the edges of the light guide 516 back into the light guide 516. Not depicted in FIG. 3 are electrical interconnects which provide control signals as well as power to the shutter assemblies 502 and the lamps 518.

In some other implementations, the roller-based light modulator 220, the light tap 250, or the electrowetting-based light modulation array 270, as depicted in FIGS. 2A-2D, as well as other MEMS-based light modulators, can be substituted for the shutter assemblies 502 within the display apparatus 500.

The display apparatus 500 is referred to as the MEMS-up configuration, where the MEMS based light modulators are formed on a front surface of the substrate 504, i.e., the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in the display apparatus 500 and is oriented such that the MEMS-based light modulators are positioned on the rear surface of the top substrate, i.e., the surface that faces away from the viewer and toward the light guide 516. The MEMS-based light modulators are thereby positioned directly opposite to and across a gap from the reflective aperture layer 506. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 4:
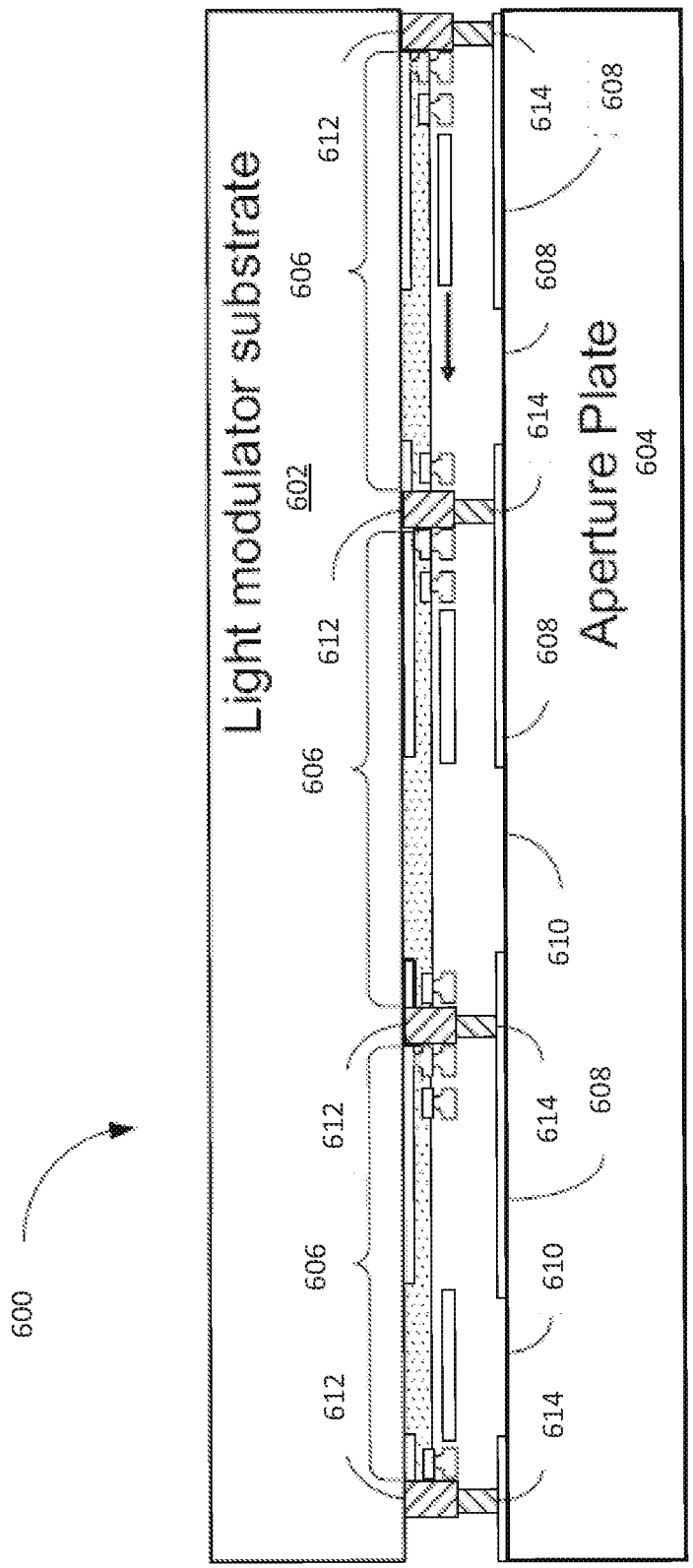
FIG. 4 shows an example cross sectional view of a light modulator substrate and an aperture plate for use in a MEMS-down configuration of a display.

FIG. 4 shows an example cross sectional view of a light modulator substrate and an aperture plate for use in a MEMS-down configuration of a display. The display assembly 600 includes a modulator substrate 602 and an aperture plate 604. The display assembly 600 also includes a set of shutter assemblies 606 and a reflective aperture layer 608. The reflective aperture layer 608 includes apertures 610. A gap or separation, which in some implementations may be predetermined, between the modulator substrates 602 and the aperture plate 604 is maintained by the opposing set of spacers 612 and 614. The spacers 612 are formed on or as part of the modulator substrate 602. The spacers 614 are formed on or as part of the aperture plate 604. During assembly, the two substrates 602 and 604 are aligned so that spacers 612 on the modulator substrate 602 make contact with their respective spacers 614.

The separation or distance of this illustrative example is 8 microns. To establish this separation, the spacers 612 are 2 microns tall and the spacers 614 are 6 microns tall. Alternately, both spacers 612 and 614 can be 4 microns tall, or the spacers 612 can be 6 microns tall while the spacers 614 are 2 microns tall. In fact, any combination of spacer heights can be employed as long as their total height establishes the desired separation.

Providing spacers on both of the substrates 602 and 604, which are then aligned or mated during assembly, has advantages with respect to materials and processing costs. The provision of a very tall, such as larger than 8 micron spacers, can be costly as it can require relatively long times for the cure, exposure, and development of a photo-imageable polymer. The use of mating spacers as in display assembly 600 allows for the use of thinner coatings of the polymer on each of the substrates.

In another implementation, the spacers 612 which are formed on the modulator substrate 602 can be formed from the same materials and patterning blocks that were used to form the shutter assemblies 606. For instance, the anchors employed for shutter assemblies 606 also can perform a function similar to spacer 612. In this implementation, a separate application of a polymer material to form a spacer would not be required and a separate exposure mask for the spacers would not be required.

Figure 5A:
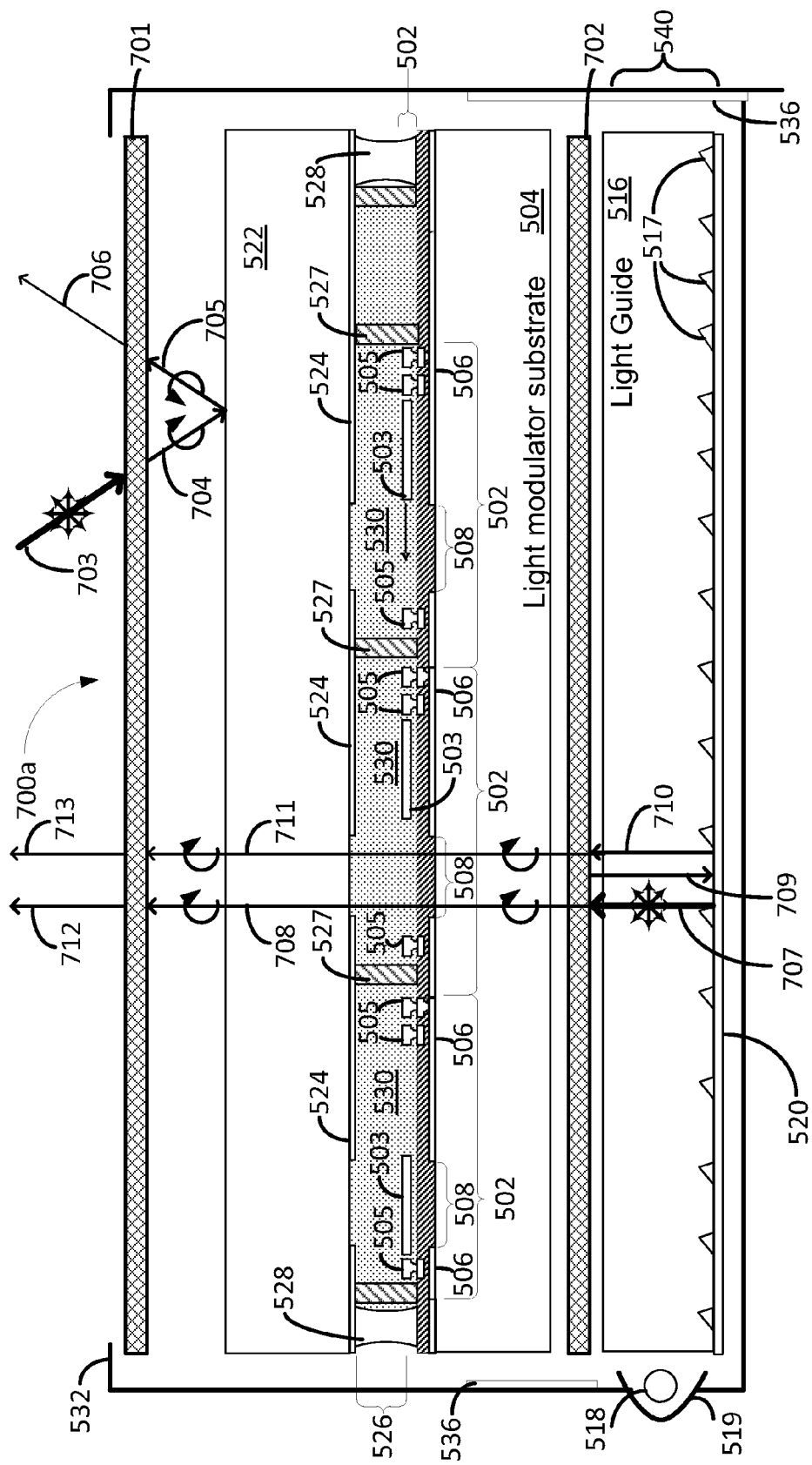
FIG. 5A shows an example cross sectional view of a display apparatus incorporating an absorbing circular polarizer and a reflective circular polarizer.

FIG. 5A shows an example cross sectional view of a display apparatus 700a incorporating an ACP 701 and a RCP 702. The display apparatus 700a shares several elements in common with the MEMS-up display apparatus 500 of FIG. 3. Such common elements are referenced by the same numerals used in FIG. 3. The display apparatus 700a, however, provides additional features that reduce ambient light reflections without considerably affecting the light output of the display apparatus 700a. Specifically, the display apparatus 700a includes the ACP 701 and the RCP 702.

The ACP 701 has a particular circular polarity, for example, right-handed or left-handed. Thus, light incident on the ACP 701 will be passed by the ACP 701 with a circular polarity. The intensity of the polarized light passed by the ACP 701, however, depends upon the polarity of the incident light. For example, incident light with the same circular polarity as the ACP 701 will propagate through the ACP 701 with substantially unattenuated intensity. On the other hand, incident light with a circular polarity that is opposite to that of the ACP 701 will propagate through the ACP 701 with its intensity substantially attenuated.

In some implementations, the ACP 701 can be provided in the form of a plastic film that is deposited over the cover plate 522. In some other implementations, the ACP 701 can be provided in the form of a glass plate placed over the cover plate 522. In some implementations, the ACP 701 is or includes a combination of a linear polarizer and a quarter wave retarder, or waveplate, arranged in such a way that a transmission axis of the linear polarizer is at an angle of 45 degrees with respect to both a fast and a slow axis of the quarter wave retarder. In such implementations, the linear polarizer and the quarter wave retarder are arranged such that the ambient light incident on the ACP 701 first passes through the linear polarizer before passing through the quarter wave retarder. The linear polarizer can be implemented, for example, using materials that include, without limitation, polyvinyl alcohol (PVA) plastic with iodine doping, dichroic crystals such as tourmaline, herapathite and cholesteric polymers. The quarter wave retarder can be implemented using materials that include, without limitation, bi-refringent materials such as silicon carbide crystals, cellophane, polystyrene, and polycarbonate. In some implementations, the ACP 701 can be or include a cholesteric liquid crystal circular polarizer.

The ACP 701 can be used for reducing the amount of ambient light reflections off of the display apparatus 700*a*. The ACP 701 achieves this reduction partly by reducing the amount of ambient light that is incident on the display apparatus 700*a* from reaching the cover plate 522 or other reflective surfaces within the display device and partly by reducing the amount of light that is reflected off of the cover plate 522 or off of the other reflective surfaces from reaching a user facing the front of the display apparatus 700*a*.

Still referring to FIG. 5A, ambient light 703, which is typically polarized evenly in all directions, is incident on the ACP 701. Such polarization of the ambient light 703 is known as random polarization. Some component of the randomly polarized ambient light 703 propagates through the ACP 701, while the remaining portion is absorbed by the ACP 701. The component of the ambient light 703 that propagates through the ACP 701 is represented in FIG. 5A by a filtered-ambient component 704. The polarity of the filtered-ambient component 704 is the same as the pass polarity of the ACP 701. The remaining ambient light 703 that is not propagated by the ACP 701 is absorbed by the ACP 701.

The filtered-ambient component 704 is incident on the cover plate 522 or other reflective surfaces within the display. The cover plate 522 and other reflective surfaces will reflect a portion of the incident filtered-ambient component 704 back towards the ACP 701. This reflected portion is represented in FIG. 5A by a reflected-component 705. Most reflective surfaces reflect light in a manner such that the circular polarity of light reflected off of the reflective surface is of the opposite handedness to the circular polarity of the incident light on the surface, prior to its reflection. In this manner, the cover plate 522 and other reflective surfaces will, upon reflection, alter the polarity of the reflected-component 705 such that its polarity is the opposite to the polarity of the filtered-ambient component 704. Because the polarities of the filtered-ambient component 704 and the ACP 701 are the same, the polarity of the reflected-component 705 will be the opposite to that of the ACP 701. Therefore, most of the reflected component 704 is substantially absorbed by the ACP 701. Only a small portion, if any, may propagate through the ACP 701. This light is represented in FIG. 5A by a filtered-reflected component 706. Thus, the user viewing the display apparatus 700*a* receives little to no reflected ambient light 703 from the display apparatus 700*a*.

The ACP 701, by practically eliminating or considerably reducing the intensity of reflections of the ambient light 703 from reaching the user, improves the display characteristics of the display device 700*a*. Such display characteristics can include, for example, contrast ratio, luminance, and color gamut.

As mentioned above, the display apparatus 700*a* also includes the RCP 702. The RCP 702 is similar to the ACP 701 in that for a randomly polarized incident light, the RCP 702 passes a portion of the incident light that has a polarization that is the same as the polarization of the RCP 702. However, unlike the ACP 701, which absorbs the portion of the incident light that it fails to pass, the RCP 702, instead, reflects the portion of the incident light having an opposite handedness as the RCP 702. The circular polarity of the RCP 702 is selected to be the same as the circular polarity of the ACP 701. For example, if the circular polarity of the ACP 701 is left-handed, then the circular polarity of the RCP 702 is also selected to be left-handed.

In some implementations, the RCP 702 includes a combination of a reflecting linear polarizer and a quarter wave retarder arranged in such a way that a transmission axis of the reflecting linear polarizer is at an angle of 45 degrees with respect to both a fast and a slow axis of the quarter wave retarder. In such implementations, the reflecting linear polarizer and the quarter wave retarder are arranged such that the light received from the backlight 540 first passes through the reflecting linear polarizer before passing through the quarter wave retarder. Some examples of the reflecting linear polarizers include, without limitation, various Dual Brightness Enhancement Films (DBEFs) sold by VIKUITI™. Of course, reflecting linear polarizers other than the ones sold by VIKUITI™ also can be included. The quarter wave retarder can be similar to the ones discussed above with respect to the ACP 701.

Still referring to FIG. 5A, the RCP 702 and the front-facing reflecting film 520 together provide a light recycling functionality. As noted above, the backlight 540 includes the light guide 516, the light source 518 and the reflector 519. The RCP 702 is disposed over the light guide 516 or backlight 540 such that the reflective surface of the RCP 702 faces the backlight 540. Light received from the backlight 540 is typically randomly polarized, a portion of which is indicated in FIG. 5A by a first backlight-incident-light 707. Note that the first backlight-incident-light 707 may be incident on the RCP 702 at any angle sufficient to escape the total internal reflection conditions provided by the backlight 540. The angle of incidence shown in FIG. 5A is only one example. The RCP 702 will pass a portion of the first backlight-incident-light 707 towards the front of the display apparatus 700*a*. This passed portion is indicated in FIG. 5A by a first backlight-transmitted-component 708. The first backlight-transmitted-component 708 has a polarity that is the same as the polarity of the RCP 702 and the ACP 701. Most of the remaining portion of the first backlight-incident-light 707 that is not passed by the RCP 702 is reflected back into the backlight 540 as a reflected-backlight-component 709.

The reflected-backlight-component 709 is incident on the front-facing reflecting film 520. Because the reflecting film 520 has high reflectivity, it will reflect a substantial portion of the reflected-backlight-component 709 back towards the RCP 702. This reflected portion that is incident on the RCP 702 is indicated in FIG. 5A by a second backlight-incident-light 710. The second backlight-incident-light 710, similar to the first backlight-incident-light 707, also may have a randomized polarity. In some instances, the reflecting film 520 may alter the polarity of a portion of the second backlight-incident-light 710 such that the polarity is the opposite of the polarity of the reflected-backlight-component 709.

The RCP 702 passes a portion of the incident second backlight-incident-light 710 towards the front of the display apparatus 700*a*. This passed portion is indicated in FIG. 5A by a second backlight-transmitted-component 711. Similar to the first backlight-transmitted-component 708, the second backlight-transmitted-component 711 will also have a polarity that is the same as the polarity of the RCP 702 and the ACP 701. Most of the remaining portion (not shown) of the second backlight-incident-light 710 that was not passed will be reflected back to the reflecting film 520.

Thus, a substantial portion of the first backlight-incident-light 707 that is not passed by the RCP 702 at one instant in time, is recycled and made incident on the RCP 702 (for example, as the second backlight-incident-light 710) at a second instant in time. At the second instant in time, a substantial portion of the recycled incident light that is not passed by the RCP 702 is again recycled and made incident on the RCP 702 at a future time. This process continues until substantially all of the first backlight-incident-light 707 is passed towards the front of the display apparatus 700a or is absorbed by various surfaces of the display apparatus 700a.

The first backlight-transmitted-component 708 and the second backlight-transmitted-component 711, passed by the RCP 702, can be incident on the aperture layer 506. Because the shutter 503 is in an open position, the first backlight-transmitted-component 708 and the second backlight-transmitted-component 711 propagate through the aperture 508 and the cover plate 522 and are incident on the ACP 701.

As mentioned above, the light passed by the RCP 702 towards the front of the display apparatus 700a has a polarity that is the same as the pass polarity of the RCP 702. Thus, the first backlight-transmitted-component 708 and the second backlight-transmitted-component 711 both have a polarity that is the same as the polarity of the RCP 702. Furthermore, the polarity of the RCP 702 is selected to be the same as the polarity of the ACP 701. Therefore, the polarities of the first backlight-transmitted-component 708 and the second backlight-transmitted-component 711 are the same as the polarity of the ACP 701. As a result, the ACP 701 will pass both the first backlight-transmitted-component 708 and the second backlight-transmitted-component 711 towards the front of the display apparatus 700a with their intensities substantially unattenuated.

Some display apparatus utilize only an absorbing polarizer placed near the front of the display apparatus to reduce ambient light reflections. In such display apparatus, the absorbing polarizer reduces the light output of the display apparatus by around 50%. Thus, if the light output of the display apparatus without the absorbing polarizer were x, then the inclusion of the absorbing polarizer would reduce the light output to around 0.5x. But, by using the RCP 702 in conjunction with the ACP 701, experimental data shows that the light output of the display apparatus is reduced by only 40%. In other words, if the light output of the display apparatus without any polarizers were again x, then the inclusion of the RCP 702 and the ACP 701 would reduce the light output to about 0.4x. Thus, the display apparatus 700a of FIG. 5A provides an improvement in the light output of about 0.1x, which is about (0.1x/0.5x) or 20% over that of display apparatus that use only the absorbing polarizer.

In some implementations where the ACP 701 is implemented by employing a linear polarizer and a quarter wave plate, the first backlight-transmitted-component 708 and the second backlight-transmitted-component 711 are transformed into linearly polarized light after passing through the ACP 701.

Figure 5B:
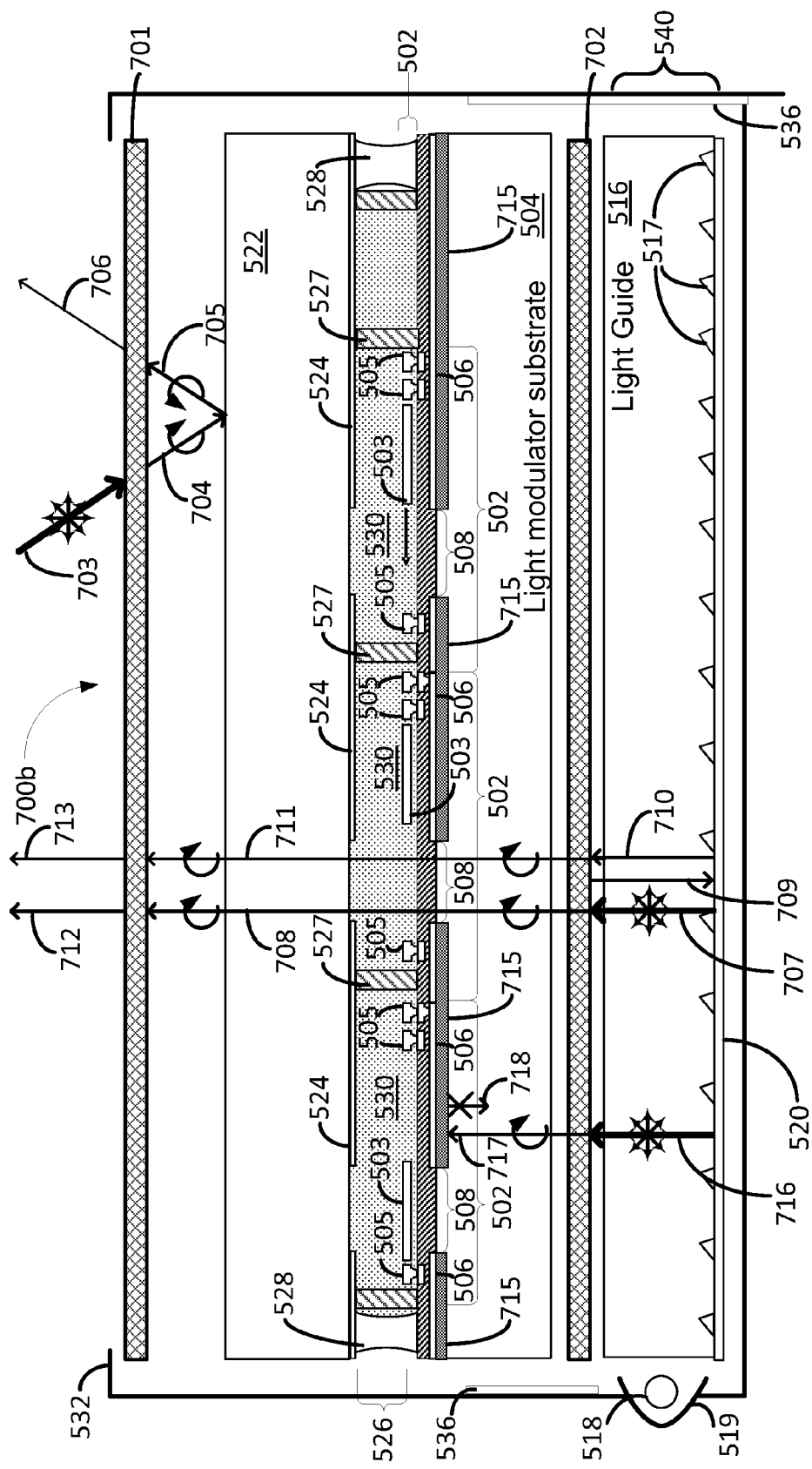
FIG. 5B shows an example cross sectional view of a display apparatus incorporating an aperture layer having a non-reflective rear facing surface.

FIG. 5B shows an example cross sectional view of a display apparatus 700b incorporating an aperture layer having a non-reflective rear facing surface 715. In particular, the display apparatus 700b of FIG. 5B includes a non-reflective surface 715 on the side of the aperture layer 506 that faces the rear of the display apparatus 700b. This is in contrast with the display apparatus 700a of FIG. 5A, which includes the aperture layer 506 that is reflective on the side that faces the rear of the display apparatus 700a. In other respects, the display apparatus 700b is similar to the display apparatus 700a of FIG. 5A, in that the display apparatus 700b also includes the ACP 701 and the RCP 702.

The non-reflective surface 715 absorbs substantially all light incident upon it emitted from the backlight 540. As shown in FIG. 5B, a third backlight-incident-light 716 is incident on the RCP 702. The third backlight-incident-light 716, similar to the first backlight-incident-light 707 discussed above in relation to FIG. 5A, is typically randomly polarized. The RCP 702 will allow a portion of the third backlight-incident-light 716 to pass through towards the front of the display apparatus 700b. This portion is indicated by a third backlight-transmitted-component 717. The third backlight-transmitted-component 717 is not aligned with an aperture 508, and therefore, cannot pass through towards the front of the display apparatus 700b. Instead, the third backlight-transmitted-component 717 is incident on the non-reflective surface 715 on the aperture layer 506.

As the non-reflective surface 715 is substantially non-reflective, the third backlight-transmitted-component 717 is substantially absorbed by the non-reflective surface 715, and a negligible amount of light, if any, is reflected back towards the rear of the display apparatus 700b. As such, improvement in the overall light output of the display apparatus 700b is similar to that of the display apparatus 700a of FIG. 5A. Specifically, the display apparatus 700b provides an improvement of about 20% in the overall light output over traditional display apparatus that use only the absorbing polarizer.

Figure 5C:
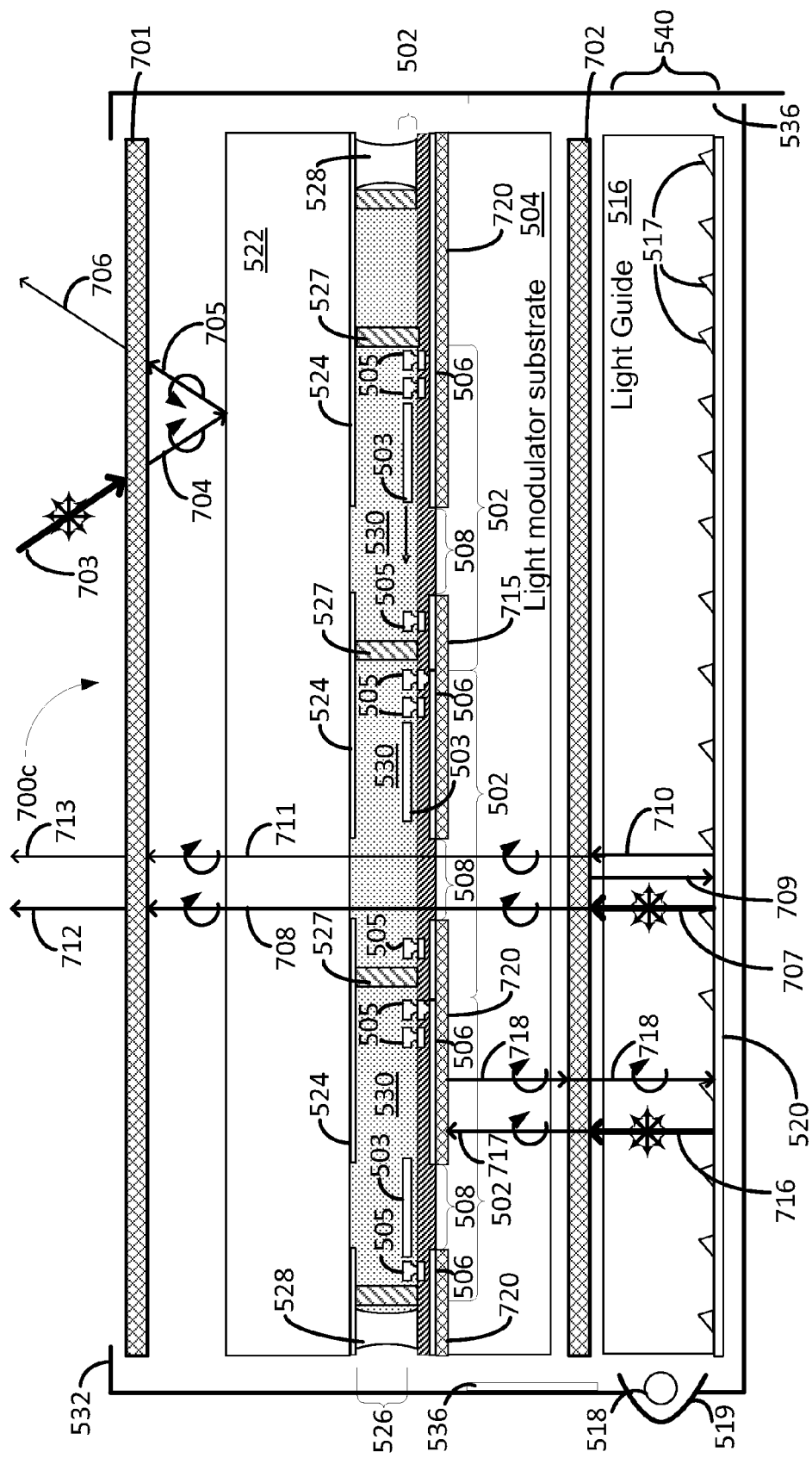
FIG. 5C shows an example cross sectional view of a display apparatus incorporating an aperture layer having a reflecting circular polarizer surface.

FIG. 5C shows an example cross sectional view of a display apparatus 700c incorporating an aperture layer having a second rear facing reflecting circular polarizer surface 720. The second reflecting circular polarizer surface 720 is substantially reflective. Furthermore, the second reflecting circular polarizer surface 720 reflects light with a circular polarity that is the same as the circular polarity of the incident light. Also, the pass through polarity of the second reflecting circular polarizer surface 720 can be the opposite to that of the RCP 702. The reflecting circular polarizer surface 720 can include cholesteric liquid crystals.

Similar to the description of the display apparatus 700b of FIG. 5B, the operation of the display apparatus 700c also can be described using the third backlight-incident-light 716 incident on the RCP 702. The RCP 702 allows a portion of this incident light to pass towards the front of the display apparatus 700c as the third backlight-transmitted-component 717. As the backlight-transmitted-component 717 is not aligned with any of the apertures 508, it is incident on the reflecting circular polarizing surface 720 of the aperture layer 506. As the reflecting circular polarizing surface 720 reflects light with the same circular polarity as that of the incident light, the third backlight-transmitted-component 717 is reflected back with the same circular polarity, as indicated by the aperture layer reflected-component 718. The aperture layer reflected-component 718 is incident on the RCP 702, and has the same polarity as the pass polarity of the RCP 702. As a result, the RCP 702 will pass a substantial portion of the aperture layer reflected-component 718 towards the rear of the display apparatus 700c. The aperture layer reflected-component 718 is incident on the reflecting film 520 and is reflected back towards the front of the display apparatus 700c. Thus, light that would have been otherwise absorbed by the aperture layer 506 is recycled back towards the front of the display apparatus.

Recycling provided by the reflecting circular polarizer surface 720 in conjunction with the front facing reflecting film 520 further contributes to the light recycling provided by the RCP 702 and the reflecting film 520 described above in relation to FIG. 5A. This additional recycling can further improve the light output of the display apparatus 700c. In some instances, the overall improvement in light output may exceed the approximately 20% improvement provided by the display apparatus 700a and 700b of FIGS. 5A and 5B, respectively.

As mentioned above, traditional approaches to reducing ambient light reflections suffer from higher power consumption attributed to the use of increased backlight output to compensate for the backlight-emitted light absorbed by the ambient light suppressing polarizer. But, for example, the display apparatus 700a of FIG. 5A reduces ambient light reflections without meaningfully absorbing backlight-emitted light. As a result, unlike traditional approaches, additional power is not required to substantially maintain the light output of the display. Thus, the display apparatus 700a (and similarly, the display apparatus 700b and 700c shown in FIGS. 5B and 5C) provides an energy efficient approach to reducing ambient light reflections.

While FIGS. 5A-5C illustrate the ACP 701 and the RCP 702 used with a MEMS-up configuration, it is understood that the ACP 701 and the RCP 702 can be readily employed in an MEMS-down configuration. As discussed above with respect to FIG. 4, in the MEMS-down configuration, the shutters and the apertures of a display apparatus are disposed on separate substrates. For example, as shown in FIG. 4, the shutters are disposed on the light modulator substrate 602, which is separate from the aperture plate 604, on which the apertures 610 are formed. Thus, in the MEMS-down configuration, the ACP 701 can be disposed over the light modulator substrate 602, while the RCP 702 can be disposed below the aperture plate 604.

Figure 6:
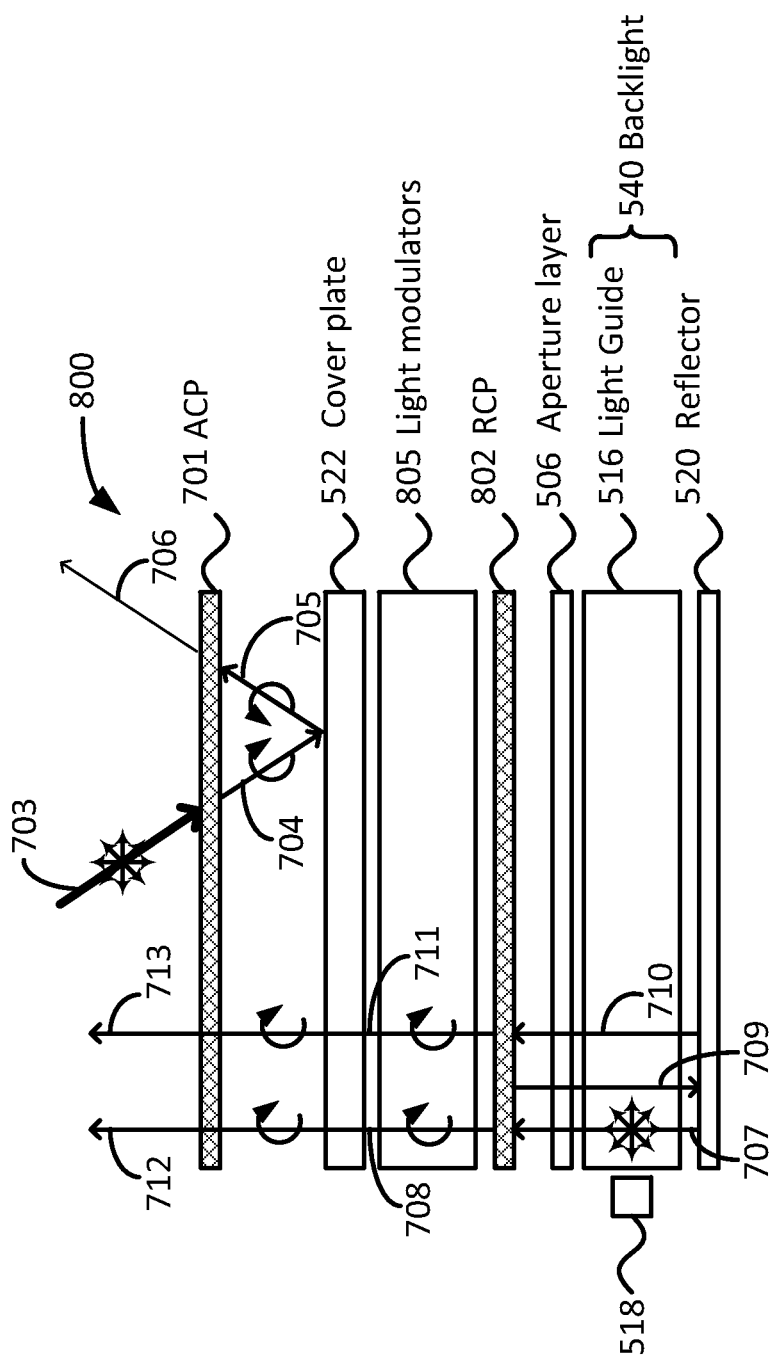
FIG. 6 shows an example cross sectional view of a display apparatus incorporating the reflective circular polarizer between an aperture layer and a shutter assembly.

FIG. 6 shows a cross sectional view of another example display apparatus 800. This display apparatus is similar to the display apparatus 700a shown in FIG. 5A, other than with respect to the placement of the RCP 702. More particularly, the display apparatus 800 incorporates a RCP 802 between an aperture layer 506 and an array of light modulators 805. Apart from this difference, the display apparatus 800 of FIG. 6 may include substantially the same components in the same configuration as those in the display apparatus 700a of FIG. 5A. In some implementations, though, the display apparatus 800 may include light modulators other than shutter assemblies, such as, without limitation, any of the light modulators shown above in FIGS. 2B-2D. FIG. 6, however, has been simplified for the purpose of illustration.

As set forth above, in FIG. 6, the RCP 702 is located between the aperture layer 506 and the array of light modulators 805. The RCP 702 and the reflective film 520 provide light recycling in a manner similar to that described above with respect to the display apparatus 700a of FIG. 5A. But in the display apparatus 800 of FIG. 6, the light recycling is carried out through the apertures (not shown) of the reflective aperture layer 506. For example, the first backlight-incident-light 707, the reflected-backlight-component 709 and the second backlight-incident-light 710 propagate through apertures in the aperture layer 506. In some instances, the light exiting the backlight 540 may not align with one of the apertures in the reflective aperture layer 506. As discussed above with reference to FIG. 3, the reflective aperture layer 506 includes a rear-facing reflective surface. Therefore, in such instances, the rear-facing reflective surface of the reflective aperture layer 506 recycles incident light by reflecting it back towards the rear of the display apparatus 900. In such an implementation, light is not reflected by the RCP 702 unless and until it passes through one of the apertures in the aperture layer 506. For lossy RCPs, i.e., RCPs that absorb more than a trivial amount of light, placing the RCP in front of the reflective aperture layer 506 may prove to be more power efficient.

Figure 7:
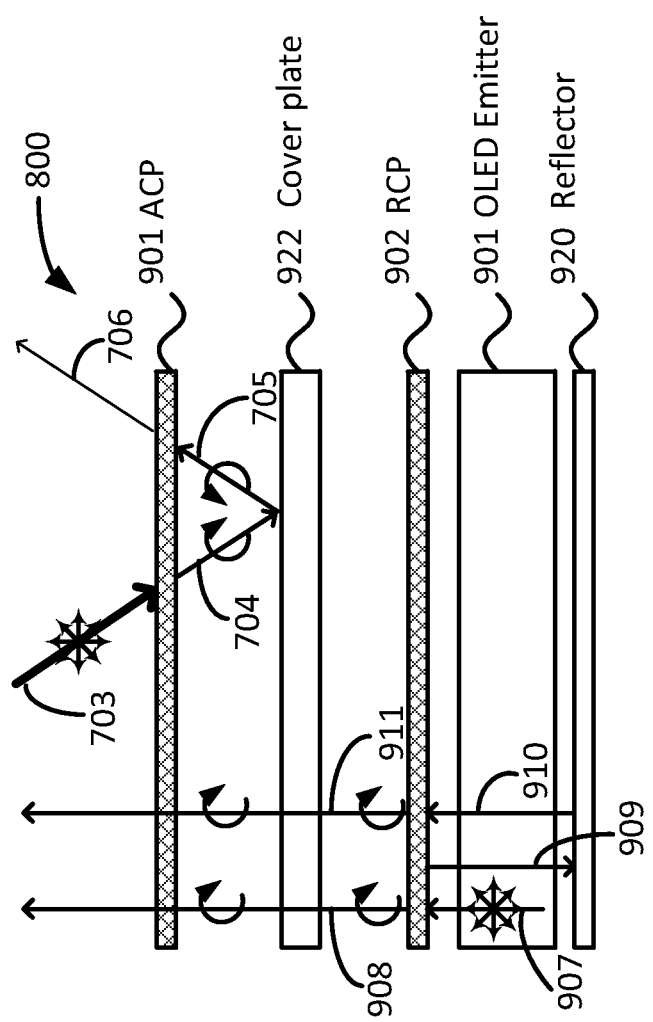
FIG. 7 shows an example cross sectional view of a display apparatus incorporating an absorbing circular polarizer and a reflective circular polarizer with an organic light emitting diode (OLED) emitter.

FIG. 7 shows a cross-sectional view of another example display apparatus 900. The display apparatus 900 incorporates an ACP 901 and a RCP 902 with an organic light emitting diode (OLED) array 901. The OLED array 901 is disposed between the RCP 902 and a reflector film 920. The ACP 901 is disposed over the cover plate 922, which, in turn, is disposed over the RCP 902. The ACP 901 and the RCP 902 can be similar to the ACP 701 and RCP 702, respectively, described above with respect to FIGS. 5A-8. As such, the ACP 901 and the RCP 902 can be implemented using the same materials as described above for implementing the ACP 701 and the RCP 702. Furthermore, the cover plate 922 and the reflector film 920 can be similar to the cover plate 522 and the reflector film 520 described above with respect to FIGS. 5A-8.

The OLED array 901 includes an array of OLED display elements, which, based on data signals received from a controller, such as the controller 134 shown in FIG. 1B, emit light to render an image frame. Each display element can include an emissive layer sandwiched between two electrodes. When the electrodes are activated by the data signals, the emissive layer emits light of its prescribed color. One portion of the light emitted by the OLED emitter 901 is indicated in FIG. 7 by a first emitter-incident-light 907, which is typically randomly polarized.

In some implementations, some or all portions of the OLED array 901 are substantially transparent. For example, in some implementations, the electrodes and the emissive layer of the OLED emitter 901, as well as the substrate on which the electrodes and emissive layer are deposited, are made of substantially transparent material. In such implementations, the RCP 902 and the reflector film 920 can provide light recycling functionality. In some implementations, electrodes below the emissive layer can be reflective, with their reflective surfaces facing the front of the display device 900. In such implementations, the light recycling functionality can be additionally provided by the reflective electrodes in conjunction with the RCP 902. In some other implementations, the substrate, on which the OLED array 901 is formed, is itself reflective or is coated with reflective material such that the reflective material substantially surrounds the individual OLED emitters in the OLED array 901. In such implementations, the OLED array substrate serves as the reflector film 920.

Referring to the aforementioned implementation where the electrodes and the emissive layer are substantially transparent, the light recycling functionality of the display apparatus 900 is similar to that of the display apparatus 700a described above with respect to FIG. 5A. The first emitter-incident-light 907, emitted by the OLED emitter 901, is incident on the RCP 902. A portion of the first emitter-incident-light 907 is passed by the RCP 902 towards the front of the display apparatus 900 with a circular polarity that is the same as the circular polarity of the RCP 902. This passed portion is indicated in FIG. 7 by a first emitter-transmitted-component 908. Some portion of the first emitter-incident-light 907 is reflected back towards the reflector film 920 through the transparent portions of the OLED array 901. This reflected portion is indicated in FIG. 7 by an emitter-reflected-component 909.

The reflector film 920 reflects a substantial portion of the emitter-reflected-component 909 back towards the RCP 902 through the transparent portions of the OLED array 901. This reflected portion is indicated in FIG. 7 by a second emitter-incident-light 910. When the second emitter-incident-light 910 is incident on the RCP 902, some portion of it is passed towards the front of the display apparatus, and this portion is indicated in FIG. 7 by a second emitter-transmitted-component 911. The circular polarity of the second emitter-transmitted-component 911 is the same as the circular polarity of the RCP 902. Again, some portion of the second emitter-incident-light 910, having a different circular polarity, is reflected back towards the reflector film 920. The above process continues until the first emitter-incident-light 907 is either transmitted towards the front of the display apparatus 900 or is absorbed by the various surfaces of the display apparatus 900.

The first emitter-transmitted-component 908 and the second emitter-transmitted-component 911 have polarities that are the same as the polarity of the ACP 901. As a result, the ACP 901 passes, without any meaningful attenuation, the first emitter-transmitted-component 908 and the second emitter-transmitted-component 911 towards the front of the display apparatus 900. In some implementations where the ACP 901 is implemented using a linear polarizer and a quarter wave plate, the ACP 901 transforms the circular polarities of the passed first and second emitter-transmitted-components 908 and 911 into linear polarities.

The ACP 901 also reduces ambient light reflections in a manner similar to the way the ACP 701 reduces ambient light reflections, as described above in relation to FIG. 5A. Thus, the display apparatus 900 reduces ambient light reflections without meaningfully attenuating the light emitted by the OLED emitter 901. As a result, unlike traditional ambient light reflection reduction approaches, less additional power is required to maintain the light output of the display. Thus, the display apparatus 900 provides an energy efficient approach to reducing ambient light reflections.

In some implementations, the display apparatus 900 can include an emitter other than the OLED emitter 901. For example, the emitter can include, without limitation, electrophoretic displays and field emission displays.

Figure 8A:
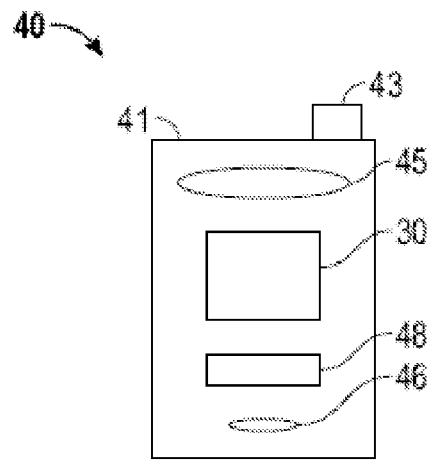
FIGS. 8A and 8B show system block diagrams illustrating a display device that includes a plurality of display elements.
Figure 8B:
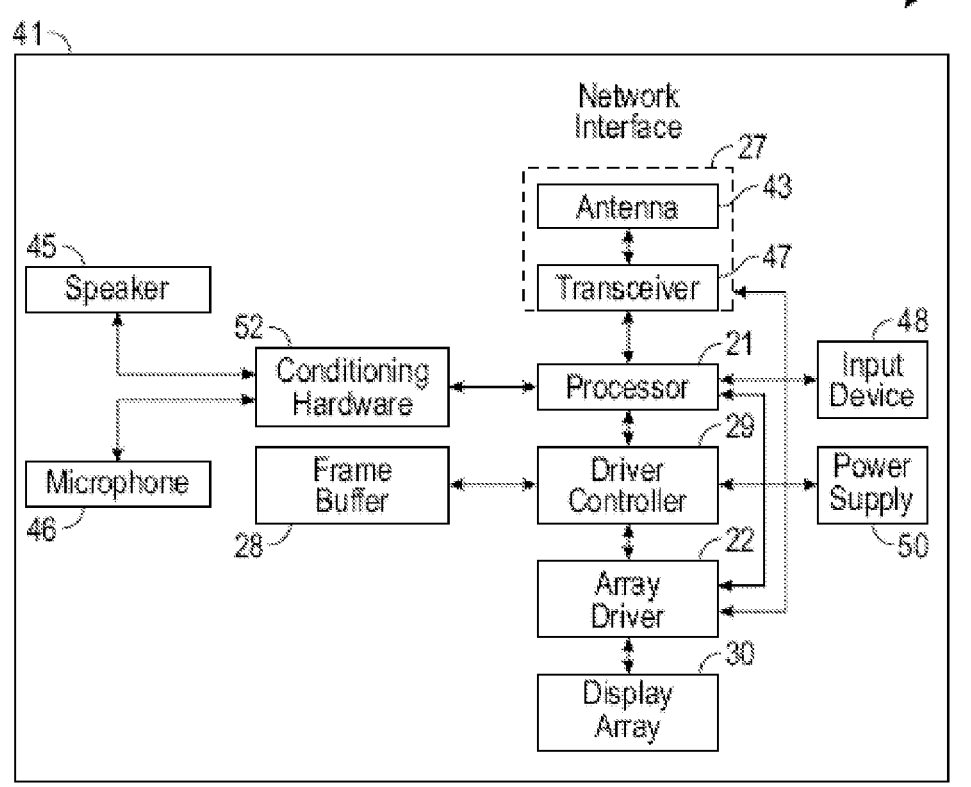

FIGS. 8A and 8B are system block diagrams illustrating a display device 40 that includes a plurality of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 8A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 8A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements. In some implementations, the array driver 22 and the display array 30 are a part of a display module. In some implementations, the driver controller 29, the array driver 22, and the display array 30 are a part of the display module.

In some implementations, the driver controller 29, the array driver 22, and the display array 30 are appropriate for any of the types of displays described herein. For example, the driver controller 29 can be a conventional display controller or a bi-stable display controller (such as a mechanical light modulator display element controller). Additionally, the array driver 22 can be a conventional driver or a bi-stable display driver (such as a mechanical light modulator display element controller). Moreover, the display array 30 can be a conventional display array or a bi-stable display array (such as a display including an array of mechanical light modulator display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photo-voltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus, comprising:
a front facing light reflective layer;
a backlight disposed in front of the front facing light reflective layer;
an aperture layer disposed in front of the backlight and configured to:
pass light through apertures defined in the aperture layer towards the front of the display apparatus, and
reflect light not passing through the apertures back towards the rear of the display apparatus;
a reflecting circular polarizing (RCP) layer disposed in front of the backlight and configured to:
pass light having a first circular polarity received from the rear of the apparatus, and
reflect light having a polarity different from the first circular polarity received from the rear of the apparatus back toward the rear of the apparatus; and
an absorbing circular polarizing (ACP) layer, disposed proximate a front surface of the apparatus and in front of the reflecting circular polarizing layer, configured to pass light having the first circular polarity and to absorb light having a polarity different from the first circular polarity.

2. The apparatus of claim 1, wherein the reflecting circular polarizing layer is disposed between the backlight and the aperture layer.

3. The apparatus of claim 1, further comprising:
a light modulation layer including a plurality of electromechanical systems (EMS) display elements, disposed in front of the reflecting circular polarizing layer and behind the absorbing circular polarizing layer, configured to selectively, responsive to image data, pass light received from the reflecting circular polarizing layer.

4. The apparatus of claim 3, wherein the aperture layer is disposed between the light modulation layer and the reflecting circular polarizing layer.

5. The apparatus of claim 4, wherein the aperture layer includes a rear facing reflecting circular polarizing surface configured to reflect light having the first circular polarity that is passed by the reflecting circular polarizing layer back towards the rear of the apparatus.

6. The apparatus of claim 1, wherein the aperture layer is disposed between the backlight and the reflecting circular polarizing layer.

7. The apparatus of claim 1, wherein the reflecting circular polarizing layer is selected from a group consisting of a reflecting linear polarizing layer in combination with a quarter wave retarder and a cholesteric liquid crystal circular polarizing layer.

8. The apparatus of claim 1, wherein the absorbing circular polarizing layer is disposed on a front surface of the apparatus.

9. The apparatus of claim 1, further comprising:
a display including:
the reflecting circular polarizing layer and the absorbing circular polarizing layer;
a processor that is configured to communicate with the display, the processor being configured to process image data; and
a memory device that is configured to communicate with the processor.

10. The apparatus of claim 9, the display further including:
a driver circuit configured to send at least one signal to the display; and
a controller configured to send at least a portion of the image data to the driver circuit.

11. The apparatus of claim 9, the display further including:
an image source module configured to send the image data to the processor, wherein the image source module includes at least one of a receiver, transceiver, and transmitter.

12. The apparatus of claim 9, the display further including:
an input device configured to receive input data and to communicate the input data to the processor.

13. A display apparatus, comprising:
a front facing light reflective layer;
a backlight disposed in front of the front facing light reflective layer;
an aperture layer disposed in front of the backlight and configured to:
pass light through apertures defined in the aperture layer towards the front of the display apparatus, and
reflect light not passing through the apertures back towards the rear of the display apparatus;
a reflecting circular polarizing (RCP) layer disposed in front of the backlight and configured to:
pass light having a first circular polarity received from the rear of the display apparatus, and
reflect light having a polarity different from the first circular polarity received from the rear of the display apparatus back toward the rear of the display apparatus;
a light modulation layer including a plurality of electromechanical systems (EMS) display elements, disposed in front of the reflecting circular polarizing layer, configured to, responsive to image data, selectively pass light received from the reflecting circular polarizing layer; and an absorbing circular polarizing (ACP) layer, disposed in front of the light modulation layer, configured to pass light having the first circular polarity and to absorb light having a polarity different from the first circular polarity.

14. The apparatus of claim 13, wherein the reflecting circular polarizing layer is disposed between the backlight and the aperture layer.

15. The display apparatus of claim 13, wherein the reflecting circular polarizing layer is selected from a group consisting of a reflecting linear polarizing layer in combination with a quarter wave retarder and a cholesteric liquid crystal circular polarizing layer.

16. The display apparatus of claim 13, wherein the absorbing circular polarizing layer is fabricated on a front surface of the apparatus.

17. The apparatus of claim 13, wherein the aperture layer is disposed between the backlight and the reflecting circular polarizing layer.

18. A display apparatus, comprising:
a front facing light reflective layer;
a backlight means, disposed in front of the front facing light reflective layer, for providing uniform illumination of the display apparatus;
an aperture layer disposed in front of the backlight and configured to:
  pass light through apertures defined in the aperture layer towards the front of the display apparatus, and
  reflect light not passing through the apertures back towards the rear of the display apparatus;
reflecting circular polarizing means disposed in front of the backlight, for passing light having a first circular polarity received from the rear of the display apparatus and for reflecting light having a polarity different from the first circular polarity received from the rear of the display apparatus back toward the rear of the display apparatus; and
absorbing circular polarizing means, disposed proximate a front surface of the display apparatus and in front of the reflecting circular polarizing means, for passing light having the first circular polarity and absorbing light having a polarity different from the first circular polarity.

19. The display apparatus of claim 18, wherein the absorbing circular polarizing means is disposed on a front surface of the display apparatus.

20. The display apparatus of claim 18, further comprising:
light modulating means including a plurality of electromechanical systems (EMS) display elements, disposed in front of the reflecting circular polarizing means and behind the absorbing circular polarizing means, for selectively, responsive to image data, passing light received from the reflecting circular polarizing means.

21. The apparatus of claim 18, wherein the aperture layer is disposed between the backlight means and the reflecting circular polarizing means.

22. The apparatus of claim 18, wherein the reflecting circular polarizing means is disposed between the backlight means and the aperture layer.

23. A method, comprising:
receiving light from a backlight located at the rear of a display apparatus;
using a reflecting circular polarizer to pass light having a first circular polarity towards the front of the display apparatus;
using the reflecting circular polarizer to reflect light having a polarity different from the first circular polarity back towards the rear of the display apparatus;
using a front facing reflective film disposed behind the backlight to reflect light from the backlight and the reflecting circular polarizer towards the front of the display apparatus;
using an aperture layer disposed in front of the backlight to pass light through apertures defined in the aperture layer towards the front of the display apparatus;
using the aperture layer to reflect light not passing through the apertures back towards the rear of the display apparatus; and proximate to the front of the display apparatus, absorbing light having a polarity different from the first circular polarity using an absorbing circular polarizer.

* * * * *